United States Patent
Vinciarelli et al.

[19]

[11] Patent Number: 6,031,726

[45] Date of Patent: *Feb. 29, 2000

[54] LOW PROFILE MOUNTING OF POWER CONVERTERS WITH THE CONVERTER BODY IN AN APERTURE

[75] Inventors: Patrizio Vinciarelli, Boston; Jay Prager, Tyngsboro, both of Mass.

[73] Assignee: VLT Corporation, San Antonio, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/552,522

[22] Filed: Nov. 6, 1995

[51] Int. Cl.[7] ............................... H05K 1/11; H05K 1/14; H05K 1/18

[52] U.S. Cl. ............................ 361/761; 361/764; 361/803

[58] Field of Search ..................................... 174/260, 261; 228/179.1, 180.1; 257/723, 724, 700; 361/761–764, 784, 785, 790, 803; 439/68, 69, 60, 59, 83, 74

[56] References Cited

U.S. PATENT DOCUMENTS

| | | |
|---|---|---|
| 2,917,678 | 12/1959 | Tepper ..................................... 361/761 |
| 3,205,408 | 9/1965 | Boehm et al. ........................... 361/761 |
| 3,621,338 | 11/1971 | Rogers et al. . |
| 3,683,241 | 8/1972 | Duncan . |
| 4,138,711 | 2/1979 | Bremenour et al. ..................... 361/760 |
| 4,400,762 | 8/1983 | Bartley et al. ........................... 361/761 |
| 4,417,296 | 11/1983 | Schelhorn ................................ 361/707 |
| 4,531,145 | 7/1985 | Wiech, Jr. . |
| 4,551,746 | 11/1985 | Gilbert et al. . |
| 4,551,747 | 11/1985 | Gilbert et al. . |

(List continued on next page.)

FOREIGN PATENT DOCUMENTS

| | | |
|---|---|---|
| 0 141 582 | 5/1985 | European Pat. Off. . |
| 50-48579 | 5/1975 | Japan ............................... G09F 9/00 |
| 63-146940 | 9/1988 | Japan .............................. H01H 50/14 |
| 1-73966 | 5/1989 | Japan ................................ H05K 1/18 |
| 2-142173 | 5/1990 | Japan ..................................... 257/787 |
| 2-151095 | 6/1990 | Japan ....................................... 439/83 |
| 2-129766 | 10/1990 | Japan ................................ H05K 1/18 |
| 3-29389 | 2/1991 | Japan ....................................... 439/83 |
| 5-315192 | 11/1993 | Japan ................................... 361/761 |
| 6-509686 | 10/1994 | Japan ................................ H05K 7/20 |
| 7-143747 | 6/1995 | Japan ................................ H02M 3/28 |
| 2 214 731 | 6/1989 | United Kingdom . |

OTHER PUBLICATIONS

Gates and Yokoro, "Sealed Chip-on-board Circuit Protection", 3rd International SAMPE Electronics Conference, pp. 929–938, Jun. 1989.

Lambda Electronics, Inc.—The new RM Series telecommunications power modules (brochure) Sep. 1995.

*Primary Examiner*—Leo P. Picard
*Assistant Examiner*—John B. Vigushin
*Attorney, Agent, or Firm*—Fish & Richardson P.C.

[57] ABSTRACT

Power conversion apparatus includes a circuit board and a power converter. The circuit board has top and bottom faces separated by a thickness, and an aperture penetrating through the thickness from the top face to the bottom face. The power converter has a body, and an electrical conductor extending from the body and having a free end to make electrical connection from the converter. The body of the power converter lies in the aperture and extends above the aperture on the side of the board which has the top face. The conductor extends from the body at a location which is below the top face.

The power converter is mounted on the circuit board by inserting it through the aperture from the side of the board bearing the bottom face so that a body of the converter lies in the aperture and extends above the aperture on the side of the board which has the top face. The circuit board is connected to an electrical conductor that extends from the power converter.

5 Claims, 12 Drawing Sheets

U.S. PATENT DOCUMENTS

| | | | |
|---|---|---|---|
| 4,622,621 | 11/1986 | Barre | 361/764 |
| 4,724,283 | 2/1988 | Shimada et al. | |
| 4,740,414 | 4/1988 | Shaheen | 428/210 |
| 4,741,472 | 5/1988 | Barmann | 228/179.1 |
| 4,750,089 | 6/1988 | Derryberry et al. | |
| 4,769,525 | 9/1988 | Leatham | 219/209 |
| 4,783,695 | 11/1988 | Eichelberger et al. | |
| 4,783,697 | 11/1988 | Benenati et al. | |
| 4,847,136 | 7/1989 | Lo | 428/195 |
| 4,879,630 | 11/1989 | Boucard et al. | 361/707 |
| 4,918,811 | 4/1990 | Eichelberger et al. | 29/840 |
| 4,953,005 | 8/1990 | Carison et al. | |
| 4,959,750 | 9/1990 | Cnyrim et al. | 361/761 |
| 4,975,824 | 12/1990 | Huss et al. | 363/132 |
| 4,994,215 | 2/1991 | Wiech, Jr. | 264/27 |
| 5,006,673 | 4/1991 | Freyman et al. | 174/255 |
| 5,019,941 | 5/1991 | Craft | 361/707 |
| 5,019,946 | 5/1991 | Eichelberger et al. | 361/792 |
| 5,028,987 | 7/1991 | Neugebaner et al. | |
| 5,200,884 | 4/1993 | Ohashi | 361/761 |
| 5,352,851 | 10/1994 | Wallace et al. | 361/764 |
| 5,365,403 | 11/1994 | Vinciarelli et al. | 361/707 |
| 5,394,300 | 2/1995 | Yoshimura | 361/761 |

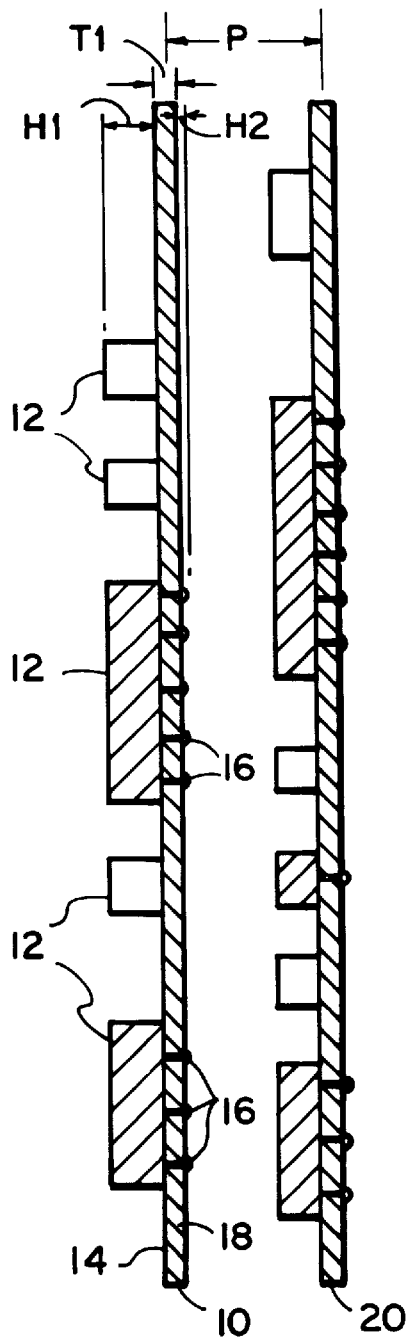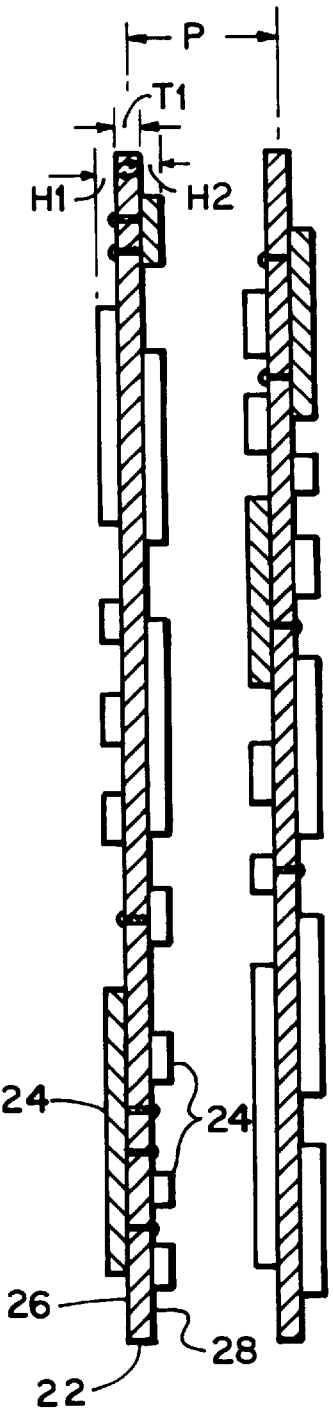
FIG. 1a
PRIOR ART
FIG. 1b
PRIOR ART

LOW PROFILE MOUNTING OF POWER CONVERTERS WITH THE CONVERTER BODY IN AN APERTURE

BACKGROUND

This invention relates to mounting power converters onto circuit boards.

In general, high packaging density (i.e., the amount of circuitry which is packaged within a given volume) is highly valued in electronic systems. As a result, the maximum height to which components and other protrusions may extend from the top and bottom surfaces of a printed circuit board (PCB) assembly is typically limited. For example, referring to FIG. 1a, a PCB 10 includes components 12 mounted to one side 14 of the PCB and component leads 16 protruding from the other side 18 of the PCB. Often, PCB 10 is mounted side-by-side in a rack (not shown) with other PCBs, for example, PCB 20. The pitch P of the PCBs within the rack (e.g., the spacing between slots into which the PCBs are inserted) is, for example, 0.6". For such a PCB assembly, the PCB thickness T1 is, for example, 0.062", the maximum allowable height H1 of the components above side 14 of the PCB is, for example, 0.400", and the maximum allowable height H2 above side 18 of the PCB is, for example, 0.060" to allow for trimmed, soldered component leads.

Referring to FIG. 1b, as another example, a PCB 22 includes components 24 mounted to both sides 26, 28 of the PCB. In this case, the maximum allowable heights H1 and H2 on both sides of the PCB is, for example, 0.190". Typically, the maximum allowable height to which components and other protrusions may extend above a surface of a PCB varies from application to application and may be symmetrical (FIG. 1b) or asymmetrical (FIG. 1a). Additionally, the maximum allowable height may be different at different locations across the PCB.

Power converters are often mounted directly to PCB assemblies to meet the specific voltage and power requirements of the assembly. For example, referring to FIG. 2, a power converter 30 is mounted to a top surface 32 of a PCB 34. Pins 36, 38, which carry power and control signals into and out of the power converter, pass through holes 40, 42 in the PCB and are soldered 44, 46 to conductive etches 50, 52 on the PCB. This arrangement is asymmetrical in that the height of the power converter extends only above surface 32 of the PCB. Additionally, the overall height $H_T$ of the assembly includes the height H3 of the power converter as well as the thickness T1 of the PCB and the height H4 of the soldered pins 36, 38 above a bottom surface 54 of the PCB. Thus, if H3 equals 0.500", the converter could be used in the PCB assembly of FIG. 1a, where H1 equals 0.500", but the converter could not be used in the PCB assembly of FIG. 1b, where H1 equals 0.250".

Many techniques have been employed to attempt to improve the packaging density of power converters within a circuit assembly. These techniques have tended to focus on reducing the height of the power converter itself. This approach, however, typically requires that the height of of sub-components, such as transformers, within the power converter be reduced, and this may impact the performance of the power converter. Thus, overall power density (i.e., the amount of power delivered per unit of total system volume occupied by the converter) may be sacrificed to achieve lower height. Other methods for improving packaging density include arranging the sub-components within the converter into configurations of minimal size and reducing the size of the component packaging. In an extreme case, a manufacturer completely removed the protective plastic case from a power converter to gain a small additional improvement in converter height.

In general, in one aspect, the invention features power conversion apparatus that includes a circuit board and a power converter. The circuit board has top and bottom faces separated by a thickness and an aperture penetrating through the thickness from the top face to the bottom face. The power converter has a body, and a first electrical conductor extending from the body in a direction generally perpendicular to the circuit board and having a free end to make electrical connection from the converter. The body of the power converter lies in the aperture and extends above the aperture mostly on the side of the board which has the top face. A second conductor is connected to the first electrical conductor and extends from the body in a direction generally parallel to the board at a location which is below the top face and connected to the electrical path. The circuit board may have an electrical path which includes a connector mounted on the board to which the second conductor is connected or contacts on the peripheral wall of the aperture. The second conductor may lie on a terminal board which may lie in the aperture or below the bottom face of the board. The second conductor may be connected to the bottom face of the circuit board. The second conductor may be part of a lead frame. The first conductor may include a contact which plugs into a socket on the terminal board or lead frame. The first conductor may include a conductive path connected to a circuit within the body and extending to the free end outside the body. The conductive path may lie on a sub-board embedded within the body of the power converter. A cap shielding the connection between the first and second conductors from the environment may be provided. The cap may pass through the aperture or may snap fit into the aperture.

The advantages of the invention may include one or more of the following. The available clearance height on both sides of a PCB and the thickness of the PCB are fully used to provide a low profile power conversion system. The overall power density of the power converter is increased.

Other advantages and features will become apparent from the following description and from the claims.

DESCRIPTION

FIGS. 1a and 1b are side sectional views of single-sided and double-sided PCBs, respectively.

Figure 10:
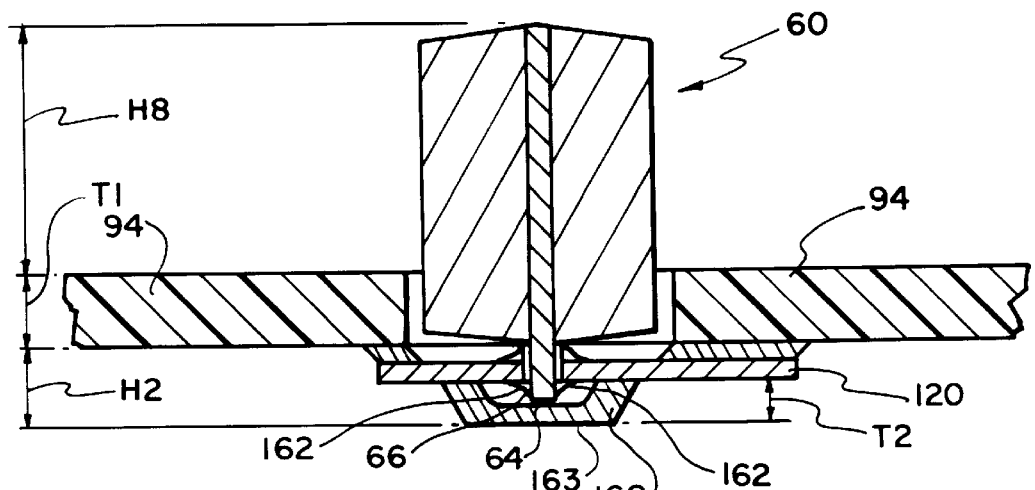
Figure 11A:
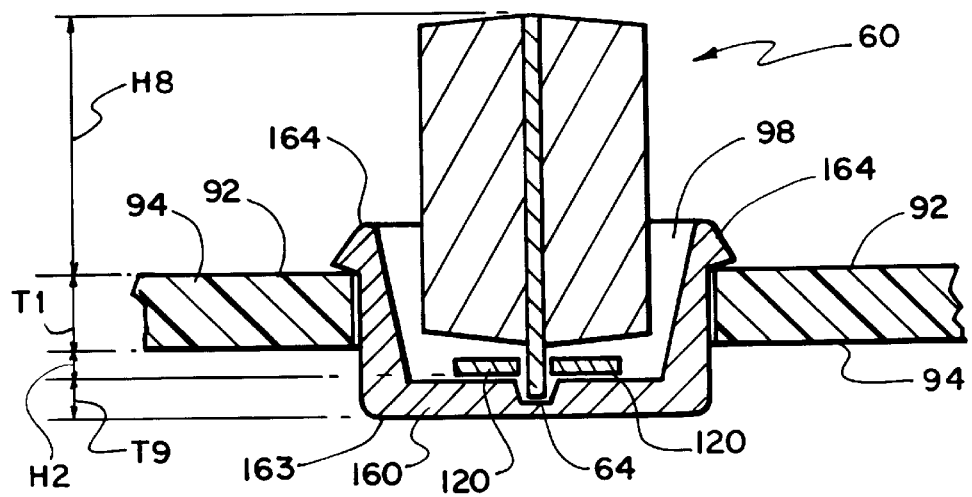
Figure 11B:
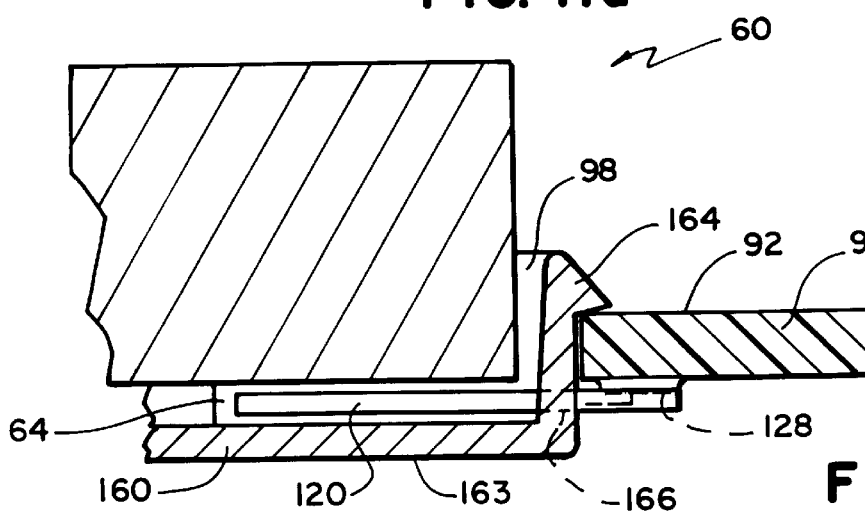

FIGS. 10, 11a, and 11b are end sectional views and a partial side sectional view, respectively, of a power converter, a terminal board, a cap, and a PCB.

Figure 12:
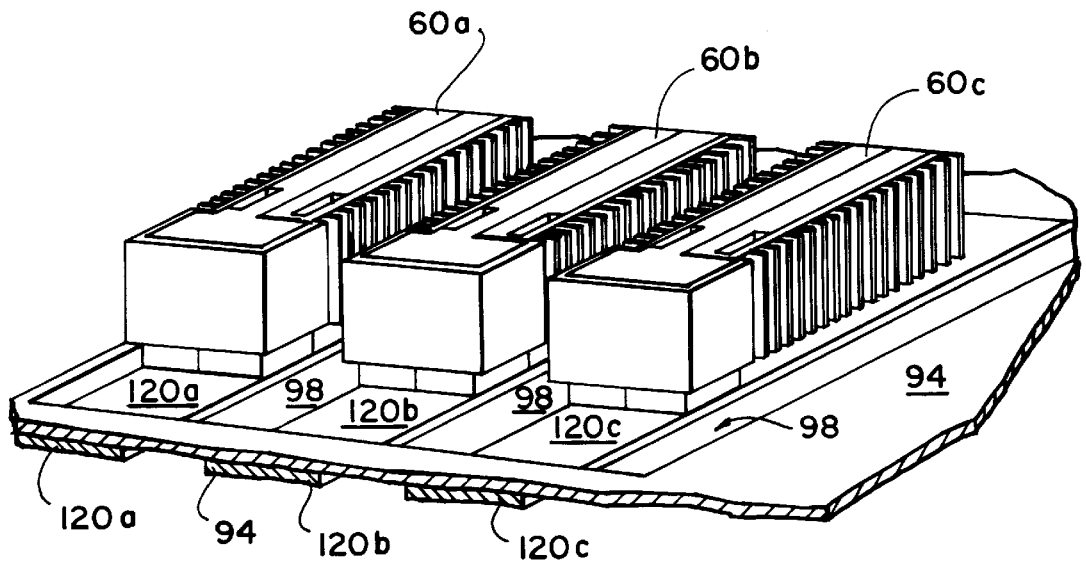

FIG. 12 is a perspective view of power converter components mounted to a printed circuit board.

Figure 13:
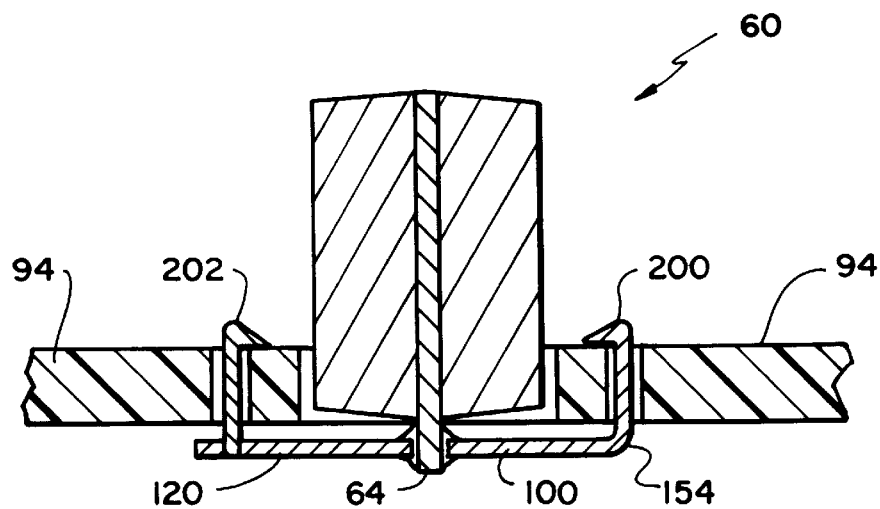
Figure 14:
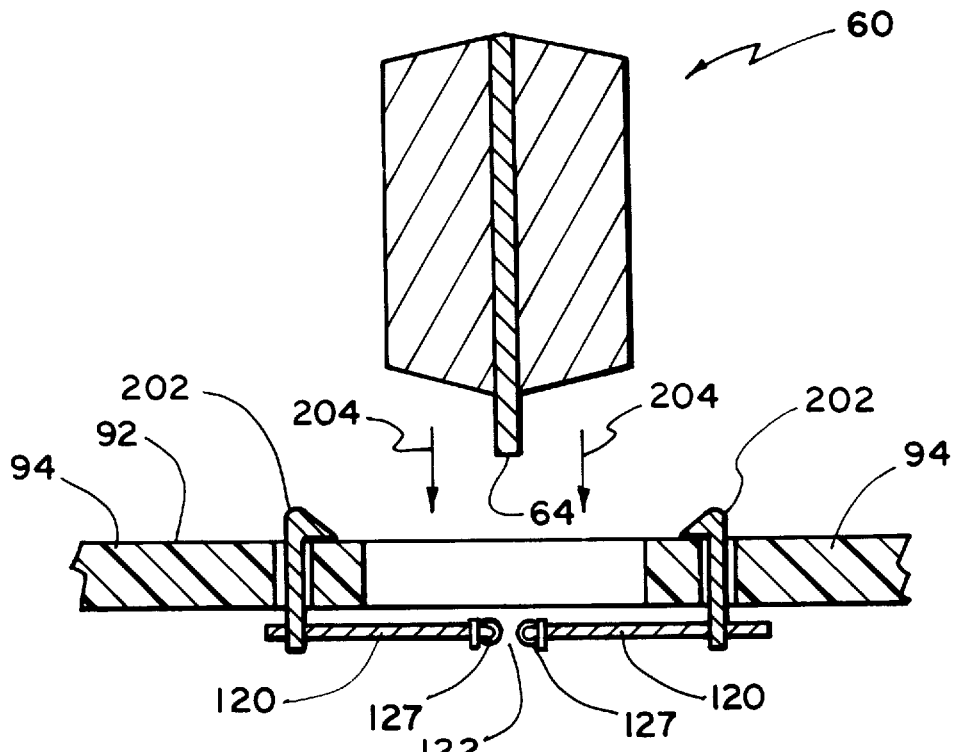

FIGS. 13 and 14 are end sectional views of a power converter, terminal board or lead, and a PCB.

Figure 15:
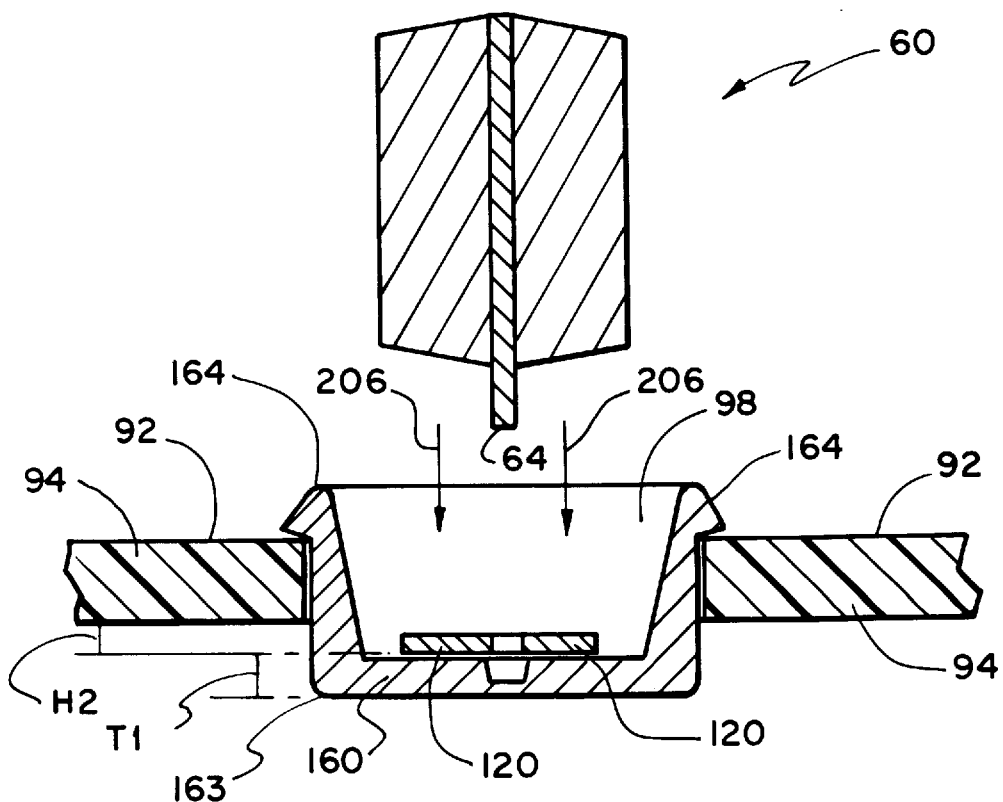

FIG. 15 is an end sectional view of a power converter, terminal board, a PCB, and a cap.

Figure 16:
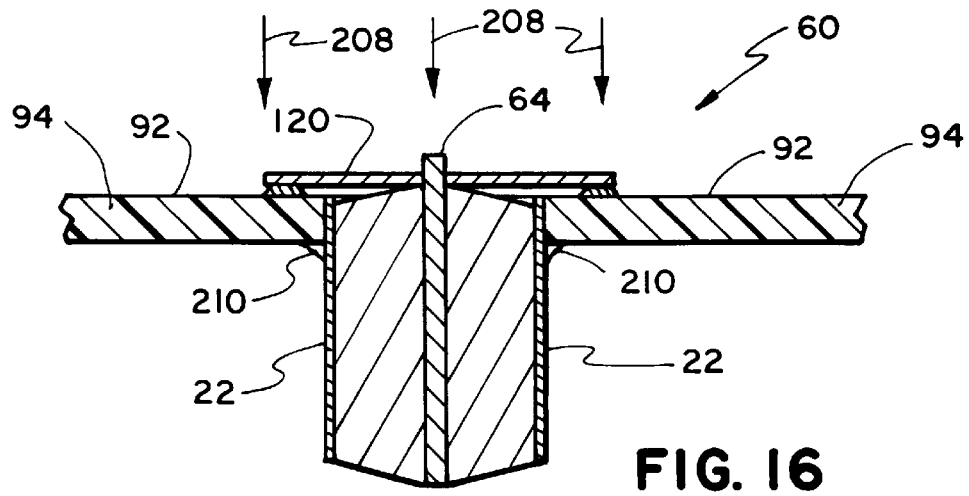

FIG. 16 is an end sectional view of a forward mounted power converter, a terminal board, and a PCB.

Figure 17:
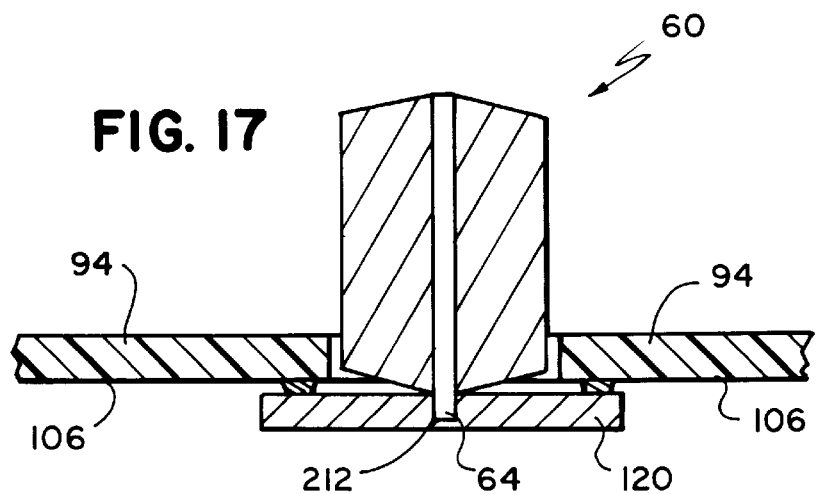

FIG. 17 is an end sectional view of a power converter, a terminal board including an indentation, and a PCB.

Figure 18:
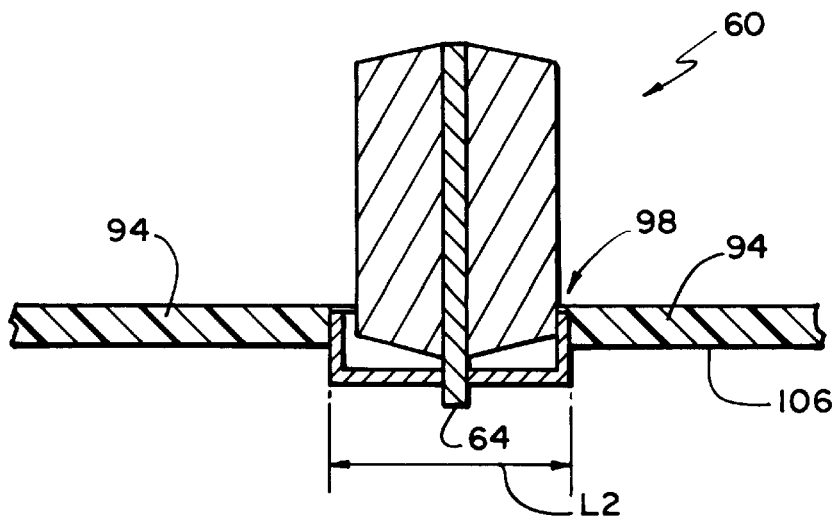

FIG. 18 is an end sectional view of a power converter and a terminal board press-fit into a PCB aperture.

Figure 3:
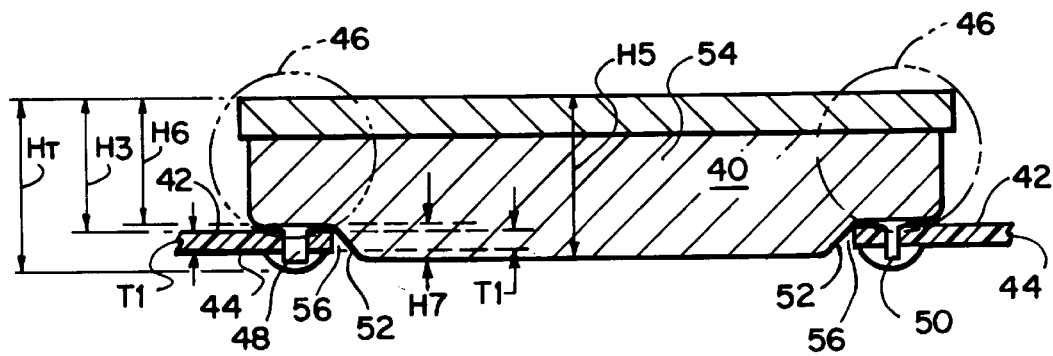

Referring to FIG. 3, to decrease the height H3 to which a power converter 40 extends above a surface 42 of a PCB 44, the end regions 46, from which pins 48, 50 extend, are stepped 52. The central region 54 of the converter is of a height H5, and the end regions of the converter are of a shorter height H6. The sub-components (not shown) internal to the converter are arranged so that the thinner sub-components are placed in the thinner end regions. One example of such a converter is described in Vinciarelli et. al, U.S. Pat. No. 5,365,403, issued Nov. 15, 1993, and entitled "Packaging Electrical Components" which is incorporated by reference. When mounted to the PCB, the central portion of the converter extends through an aperture 56 in the PCB. As a result, the extent to which the converter extends above the surface of the PCB is reduced. The height H7 of the step may be varied to adjust the extension of the converter above the top and bottom surfaces of the PCB. For example, height H7 may be sufficient to set the height H5 of the central region of the converter equal to the overall allowed height $H_T$ of the PCB assembly.

Figure 4A:
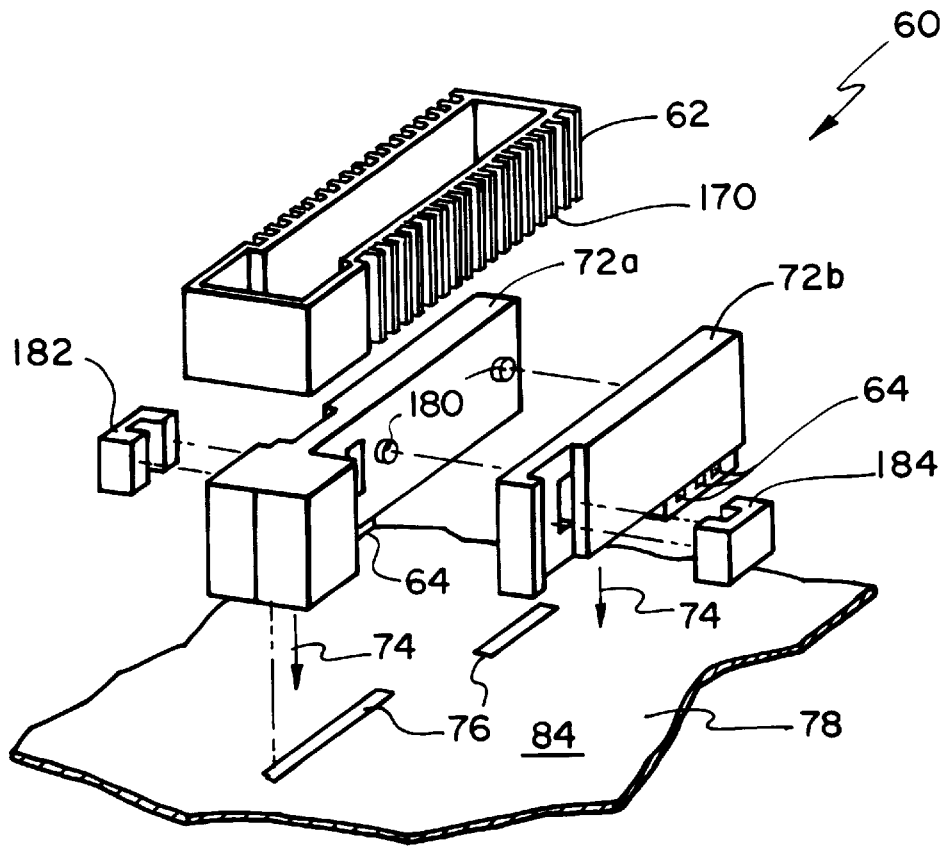
FIGS. 4a–4c are exploded, perspective, and end sectional (at 4c—4c of FIG. 4b) views, respectively, of a power converter and a PCB.
Figure 4B:
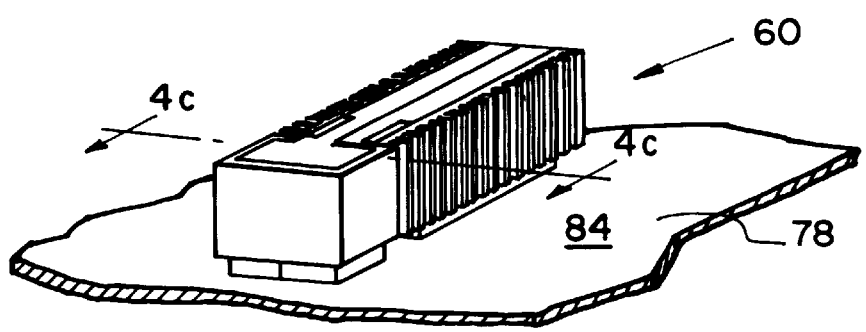
Figure 4C:
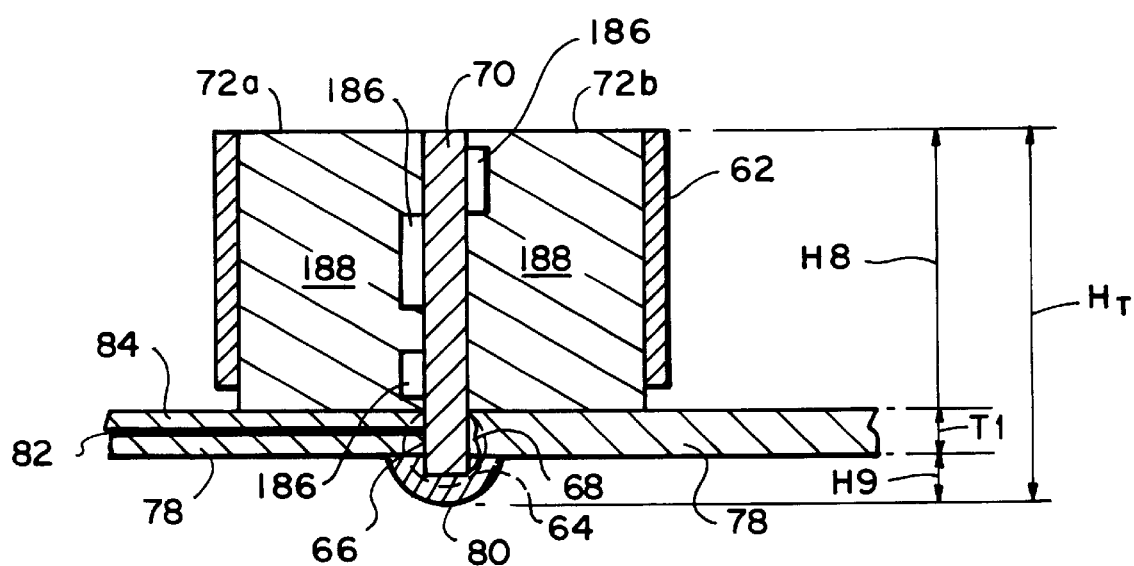

Referring to FIGS. 4a, 4b and 4c, a power converter 60 includes a heat sink 62 and electrical contacts 64. Electrical contacts 64 include contact pads 66 (FIG. 4c) on surfaces of extended portions 68 of an internal converter printed circuit board (PCB) 70. The contacts may also be conductive leads which extend from the converter body 72a, 72b. The electrical contacts are inserted (arrows 74) into slots 76 in a main PCB 78, and the electrical contacts are then soldered 80 to etches 82 in the main PCB. The overall height $H_T$ of the assembly equals the height H8 to which the converter extends above a top surface 84 of the PCB, the thickness T1 of the PCB, and the height H9 to which the soldered pin extends below a bottom surface 86 of the PCB.

Figure 5A:
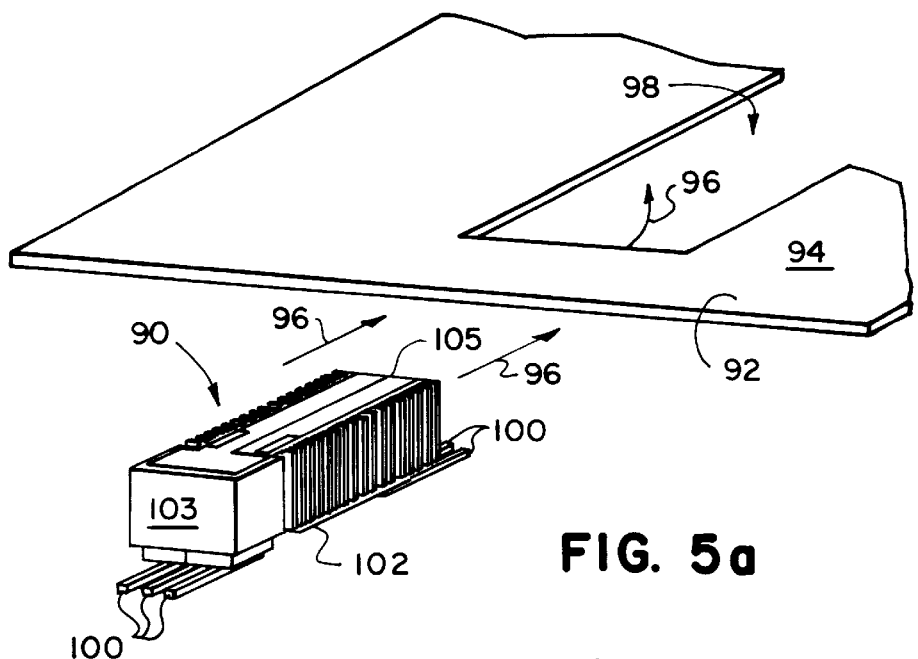
FIGS. 5a and 5b are perspective views of a power converter and a PCB.
Figure 5B:
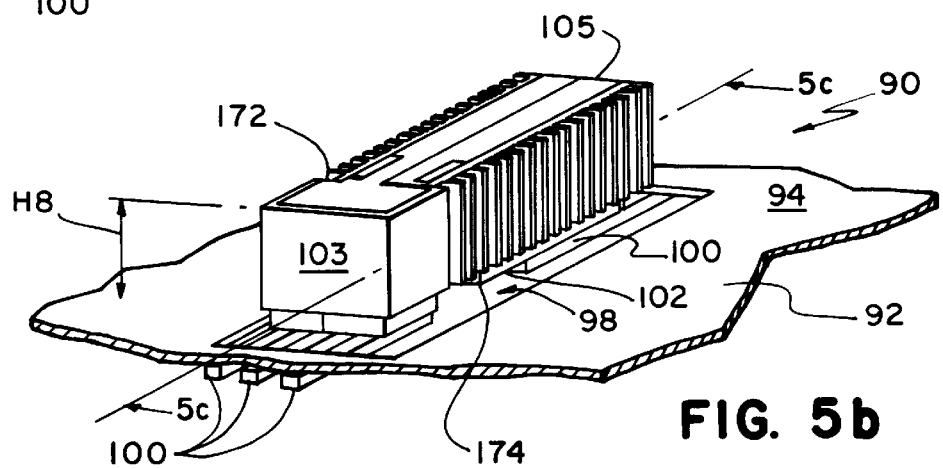
Figure 5C:
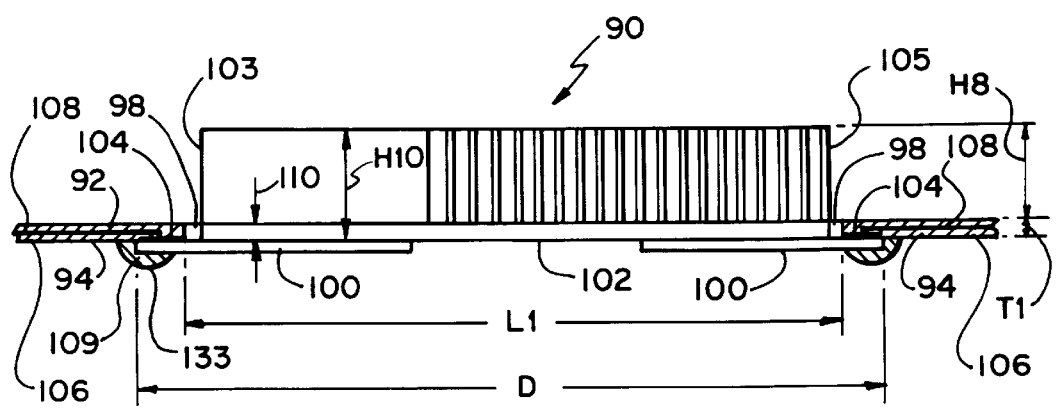
FIG. 5c is a side sectional view of the power converter and PCB of FIG. 5b.

Referring to FIGS. 5a, 5b, and 5c, to reduce the height H8 to which a converter 90 extends above a top surface 92 of a PCB 94, the converter is inserted (arrows 96) from below the PCB (i.e., reverse mounting) through an aperture 98 in the PCB. Conductive leads 100, which are connected to sub-components within the converter, extend from a bottom 102 of the converter and extend from ends 103, 105 of the converter in a plane parallel to the PCB. The distance D between the ends of leads on opposite sides of the converter is greater than the length L1 of the aperture. As a result, when the converter is inserted in the aperture, the leads contact a bottom 106 of the PCB and prevent the converter from being pushed completely through the aperture. Contact pads 104, connected to conductive etches 108 within or on a surface of the PCB, are arranged along the bottom of the PCB where the leads contact the bottom of the PCB. After inserting the converter into the aperture, the leads are soldered 109 to the contact pads.

Consequently, a portion 110 of the converter is coextensive in height with the thickness T1 of the PCB which reduces the height H8 to which the converter extends above the top surface of the PCB. If T1 equals, for example, 0.062", and the height, H10, of the converter is 0.500", then, compared to the converter mounting arrangement of FIGS. 4a–4c, the height H8 to which the converter extends above the top of the PCB has been reduced by about 12%. Compared to the mounting arrangement of FIGS. 4a–4c, the reverse mounting arrangement of FIGS. 5a–5c provides for a reduction in the overall height of the PCB assembly; allows the converter to fit within a smaller maximum allowable height restriction (e.g., H1, FIG. 1); and allows for a reduction in the pitch between slots in a multiple PCB rack.

Other embodiments are within the scope of the following claims.

Figure 6A:
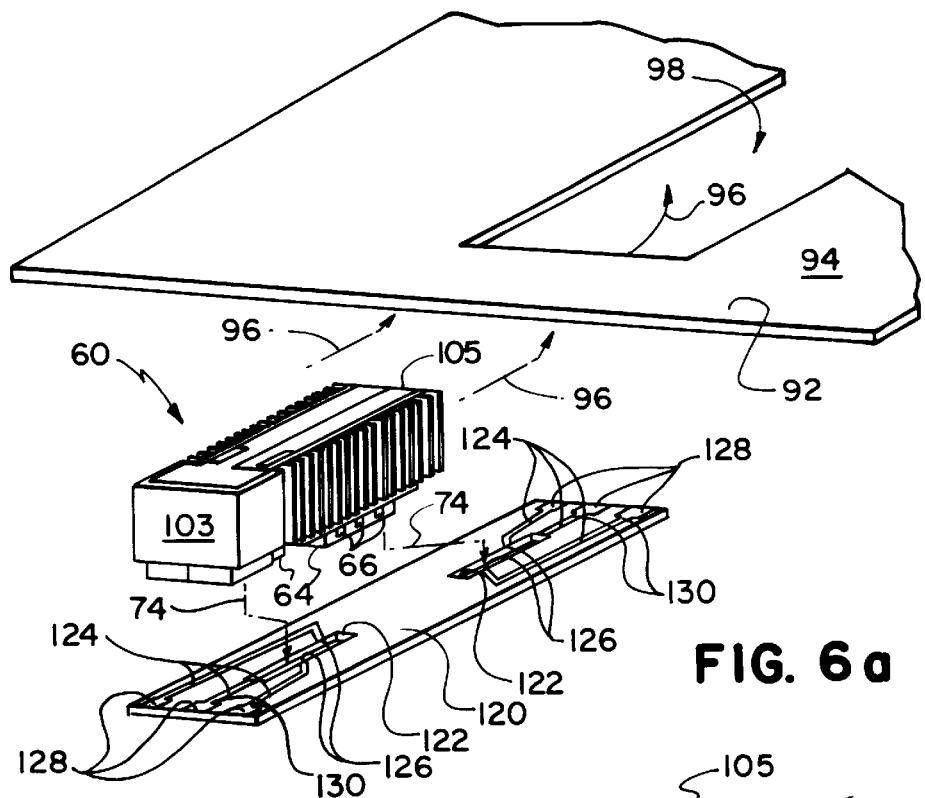
FIGS. 6a and 6b are perspective views of a power converter, a terminal board, and a PCB.
Figure 6B:
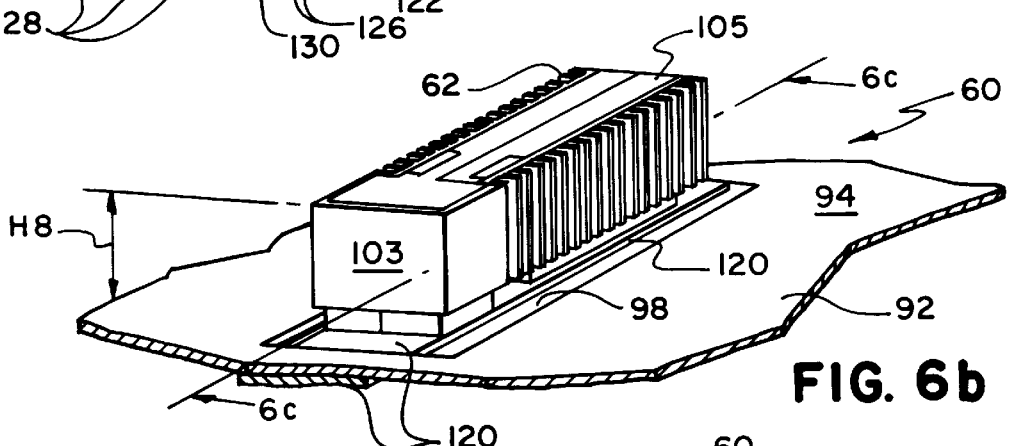
Figure 6C:
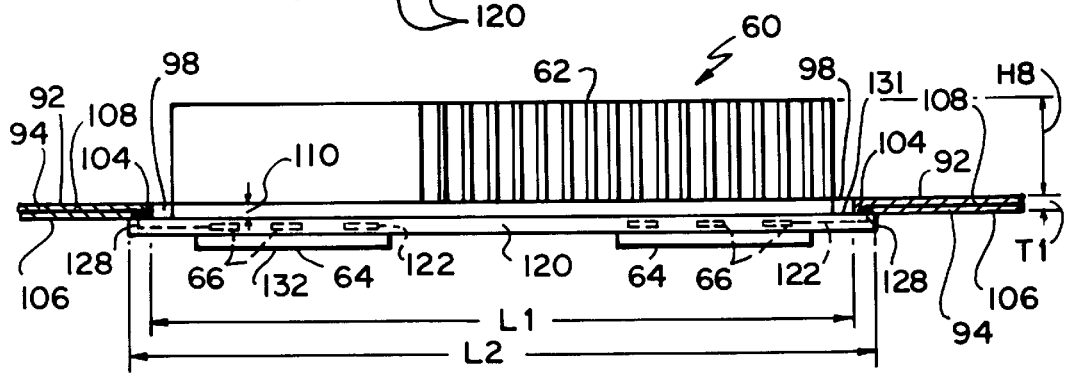
FIG. 6c is a side sectional view of the power converter, terminal board, and PCB of FIG. 6b.

For example, referring to FIGS. 6a, 6b, and 6c, instead of leads 100, portions (68, FIG. 4c) of a converter PCB (70, FIG. 4c) may extend from a converter 60 in a plane vertical to the main PCB to provide electrical contacts 64. Electrical contacts 64 include contact pads 66 which are coated with solder paste (not shown) and inserted into slots 122 of a terminal board 120. The terminal board includes conductive paths 124 that lie in a plane parallel to the main PCB 94 and that have first ends 126 corresponding to contact pads 66 and second ends 130 connected to horizontal contact pads 128. Heat is applied in the area of the slots 122 to cause the solder paste on the contact pads to flow and form solder joints with the first ends of the conductive paths. As a result, the conductive paths electrically connect vertical contact pads 66 to horizontal contact pads 128.

The combined power converter and terminal board are then inserted (arrows 96) from below the PCB into aperture 98 within main PCB 94. The length L2 of the terminal board is longer than the length L1 of aperture 98. The extended length of the terminal board prevents the power converter from being pushed completely through aperture 98 and brings contact pads 128 on the top side 131 of terminal board in contact with contact pads 104 on the bottom side 106 of PCB 94. The corresponding sets of contact pads 128 and 104 are soldered together to connect the contact pads on the terminal board (and, hence, the contact pads on the power converter) to conductive paths 108 within or on the surface of the PCB.

This mounting reduces the height H8 by which the converter extends above the PCB by allowing a portion 110 of the power converter to be coextensive in height with the thickness T1 of the PCB. The height to which the electrical contacts 64 and terminal board 120 extend below the PCB is less than or equal to the maximum allowable height H2 (FIG. 1a).

Figure 2:
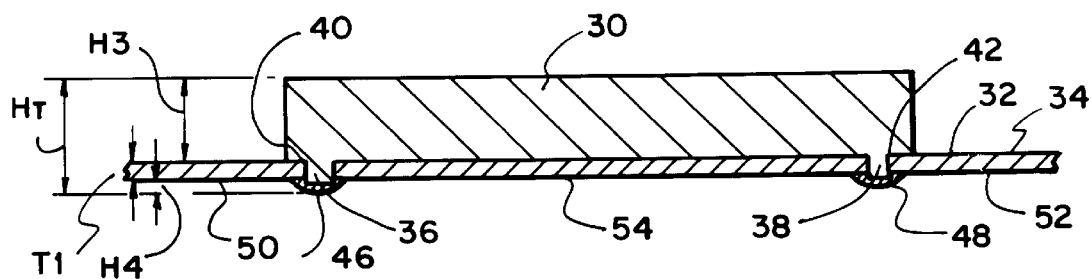
FIGS. 2 and 3 are side sectional views of power converters mounted to PCBs.
Figure 7:
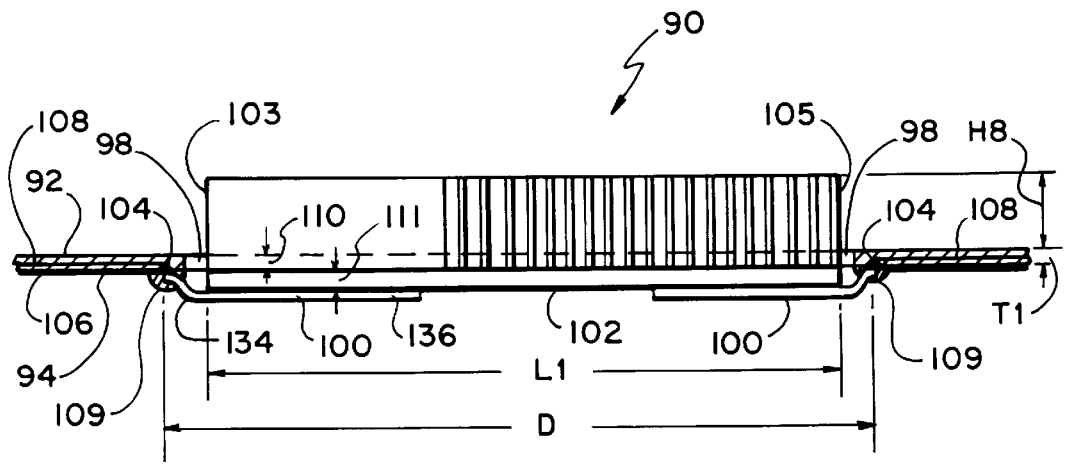
FIG. 7 is a side sectional view of a power converter and a PCB.
Figure 8:
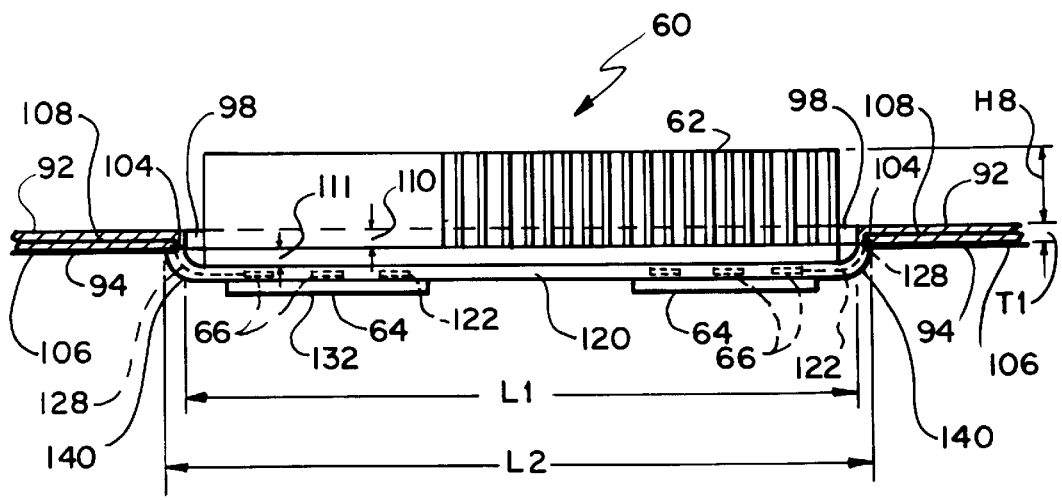
FIG. 8 is a side sectional view of a power converter, a terminal board, and a PCB.

If the distance from the bottom side 106 of the PCB to the tip 133 of the solder joint 109 (FIG. 5c) or to the edge 132 (FIG. 6c) of electrical contacts 64 is less than the maximum allowable height H2 (FIG. 2), then leads 100 may be bent 134 (FIG. 7) or terminal board 120 may be molded with rounded ends 140 (FIG. 8) to lower the converter within the aperture such that a portion 111 of the converter extends below the lower surface 106 of the PCB. The converter may be lowered to a position that locates the bottom side 136 of leads 100 or edge 132 of the electrical contacts 64 at a height below the PCB equal to the maximum allowable height H2. Lowering the converter further reduces the height H8 to which the converter extends above the PCB. For instance, the height H8 is reduced from approximately 0.500" to 0.413" (i.e., approximately 17%) when a portion 110 of the converter is coextensive in height with the thickness T1 (e.g., 0.062") of the PCB and another portion 111, of height 0.025", extends below the lower surface 106 of the PCB and is coextensive in height with a portion of the maximum allowable height H2 (e.g., 0.060) below the PCB.

Reverse mounting a component through an aperture in the PCB may be used to allow the component to fit within a maximum allowable height restriction which is smaller than that which would apply if the component were mounted over a surface of the PCB; it also may allow taller components, which may have additional functionality included in the increased space, to be mounted to the PCB while still adhering to the PCB's maximum allowable height requirements.

Figure 9A:
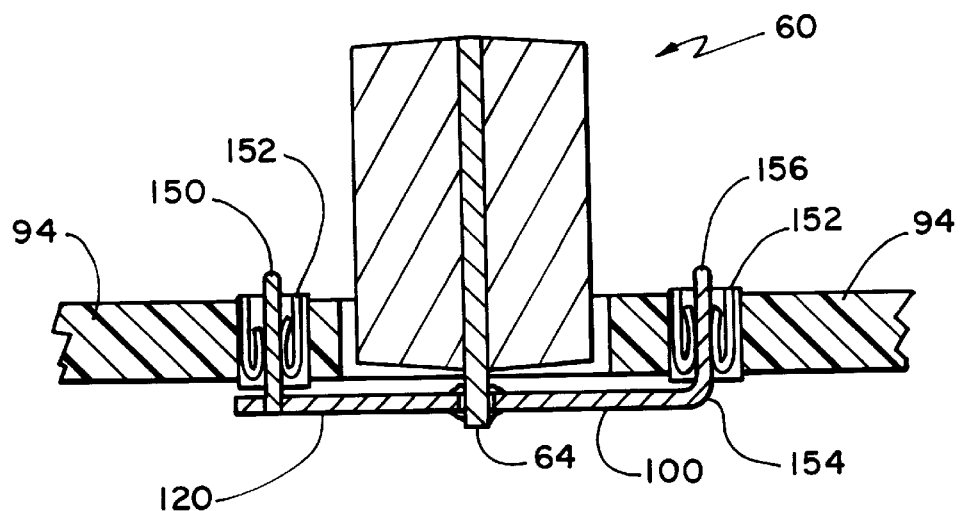
FIG. 9a is an end sectional view of a power converter, a terminal board, and a PCB.
Figure 9B:
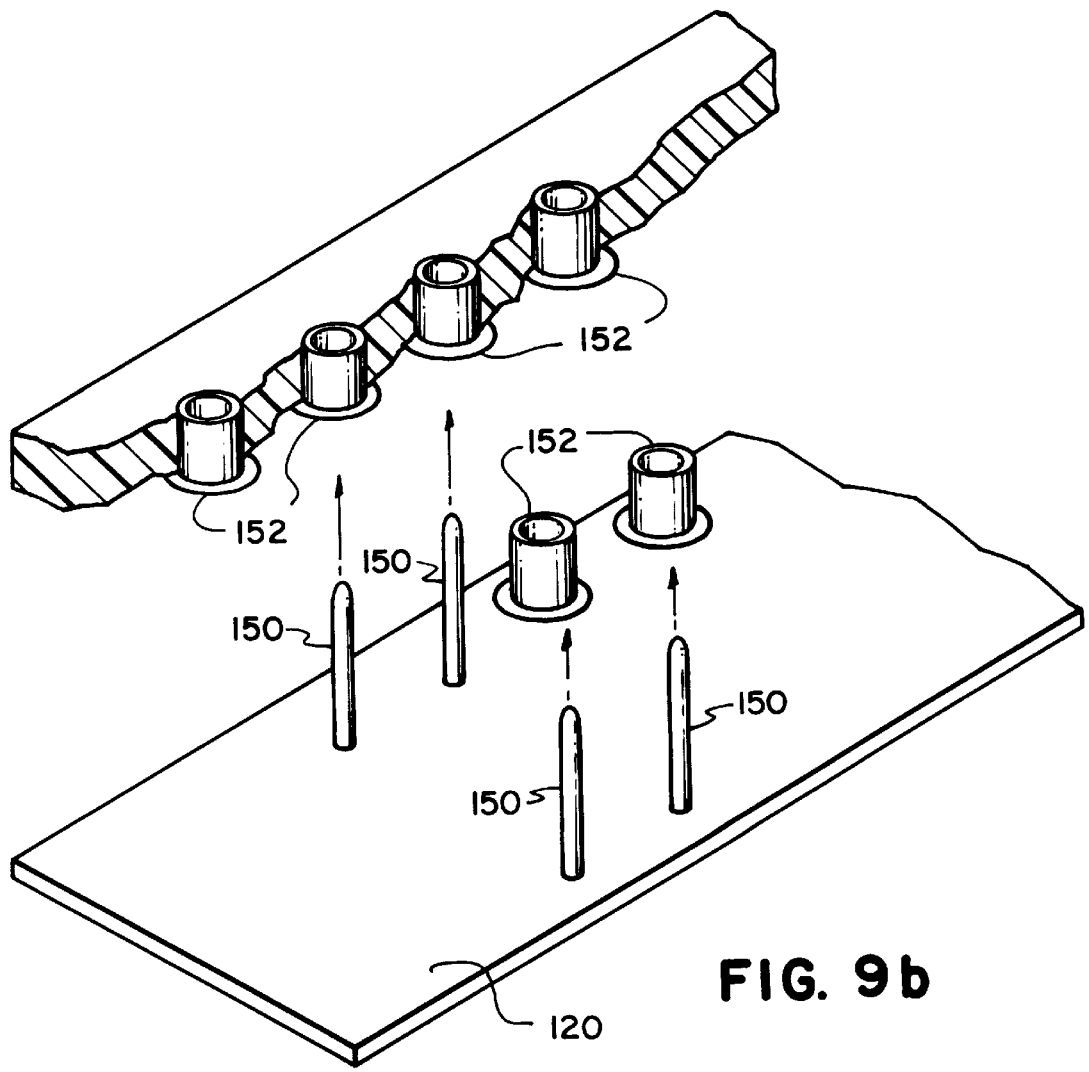
FIG. 9b is a perspective view of a lead frame scheme.

Referring to FIGS. 9a and 9b, contact pads (128, FIG. 6a) on terminal board 120 may be replaced with contact pins 150 extending from terminal board 120 and into sockets 152 in the PCB. Similarly, leads 100 (or a molded terminal board 120) may be curved 154 such that the ends 156 of the leads extend into sockets 152 in the PCB. The leads may be part of a lead frame.

Once the terminal board contact pads or leads have been soldered to the PCB, the PCB may be passed through a soldering process (e.g., a wave solder machine; an infrared reflow oven) to solder other components to the PCB. To prevent this later soldering step from disturbing the earlier formed solder joints (e.g., the solder joints between the terminal board 120 and the converter PCB 70), the solder joints may be formed from a high temperature solder that is not disturbed by the temperatures of the subsequent soldering process.

Alternatively, the earlier formed solder joints and the leads or terminal board may be protected from a later soldering process and other manufacturing steps by a cap 160 (FIG. 10). Cap 160 may be adhered through high temperature glue 162, or connected through split pins (not shown) that extend through holes (not shown) in either the terminal board 120 or the PCB 94, or a portion of the cap may be ultrasonically welded to the terminal board or PCB. Since the bottom surface 163 of the cap cannot extend beyond the maximum allowable height H2 below the PCB, the thickness T2 of the cap will reduce the extent to which the converter may extend below the PCB.

Referring to FIGS. 11a and 11b, the cap may be a snap-fit cap which includes cantilevered, hooked, edges 164 which extend up within the internal perimeter of aperture 98 (with the exception of areas 166 where terminal board 120 (or leads 100) extends across aperture 98 to overlap PCB 94). As shown, the hooked edges 164 are arranged to provide a snap-fit engagement with the top side 92 of the PCB. A benefit of the snap-fit cap is that is holds the terminal board 120 (or leads 100) in contact with the lower surface of PCB 94 during subsequent manufacturing steps. The snap-fit cap may be removed after the wave solder step or other possibly damaging manufacturing steps. If the cap is removable, the bottom surface 163 does not need to be within the maximum allowable height H2 below the PCB and the thickness T2 of the cap will not reduce the height to which the converter can be extended below the PCB.

Referring to FIG. 13, instead of a cantilevered cap, the end 200 of a bent lead 100 or the end 202 of a pin 150 may be a hook such that the bent lead or pin snaps onto the PCB. Referring to FIG. 14, such a terminal board may serve as a socket which is mounted to the PCB from the rear. After the socket is mounted, the electrical contacts 64 of power converter may be inserted (arrows 204), from the top side 92 of the PCB, into connector contacts 127 installed in terminal board 120.

Referring to FIG. 15, as another alternative, cap 160 may be a socket. The terminal board or the leads may be mounted in the socket and then the combination terminal board or leads and socket may be snap-fit mounted to the PCB from the bottom side 106 of the PCB. The power converter may then be inserted (arrows 206), from the top side 106 of the PCB, into the socket to electrically connect contacts on the converter to the leads or to contacts on the terminal board.

Referring to FIG. 16, the combination terminal board (or leads) and power converter component may also be forward mounted (as opposed to reverse mounted) by inserting the power converter through an aperture in the PCB in a direction (arrows 208) toward the bottom side of the PCB. In such a configuration, the converter extends below the PCB, the terminal board or leads lie in a plane parallel to the PCB and above the PCB. Additionally, an edge 210 of heat sink 22 may be cantilevered to provide a snap-fit mounting with the PCB.

Referring to FIG. 17, vertical electrical contacts 64 need not extend all the way through the thickness of the terminal board. Instead, contacts 64 may be inserted part way into a slot 122 (or, as illustrated in FIG. 17, part way into an indentation 212) in the terminal board. Minimizing or eliminating the extension of the converter contacts 64 (and any associated solder connections) below the terminal board 120, reduces the overall extent to which the converter extends below the bottom surface 106 of the PCB 94. However, if the contacts are not extended through the slot in the terminal board, the solder joints between the contact pads 128 and the first ends 126 of the conductive paths 124 in the terminal board are not visually exposed, which makes it more difficult to determine the quality of the solder joints.

Referring to FIG. 18, instead of having a terminal board with a length L2 (FIG. 6c) that is longer than the length L1 of aperture 98, the PCB may include electrical contacts plated along the inner edge of the aperture and the electrical contacts on the terminal board (or leads) may form a pressure fit against the plated contacts. After pressing the terminal board into the aperture, the electrical contacts between the terminal board and the PCB may be soldered. However, lower current connections may not require solder. The contacts along the inner edge of the aperture may be in recesses or scallops cut into the inner edge of the aperture.

Components other than power converters may be mounted in a similar fashion, and the components need not have vertically extending electrical contacts 64. A component with horizontal (flush) contact pads (e.g., surface mountable components) may be directly mounted to horizontal contact pads on the terminal board.

Contact pads 66 (FIG. 6a) may be placed on both sides of the electrical contact extension 64. Providing contact pads on both sides of electrical contact extension 64 may reduce the size of electrical contact extension 64 or allow for more contact pads 66 to be placed on electrical contact extension 64.

Since the aperture 98 (FIGS. 5b and 6b) is wider and longer than the body of the power converter, it allows air to flow from the bottom side 106 to the top side 92 of the PCB. This may be used advantageously to increase the flow of cooling air around heat sink 62.

Although the terminal board was described as providing electrical contacts (pins, leads, pads) on its top surface along ends 103 and 105, the terminal board may also provide electrical contacts along sides 172 and 174 (FIG. 5*b*). Providing contacts only along ends 103 and 105 allows multiple power converter components 60*a*, 60*b*, 60*c* to be positioned side by side in an enlarged aperture 98.

Instead of inserting the power converter through an aperture in a central portion of the PCB, the terminal board may provide contact pads along a side (172 or 174) of the power converter to allow the power converter to be mounted to a side of the PCB. Similarly, a slot (three sided aperture) may be provided along a side edge of the PCB for mounting the power converter. Side mounting may provide increased cooling through increased air flow or may allow for positioning of the converter adjacent to an outer wall of an enclosure to which the converter may be attached for cooling. One or more edges of the heat sink or a pin mounted on the terminal board may provide additional mechanical support.

Referring again to FIG. 4*a*, in one example, power converter 60 includes a primary converter section 72*a* and a secondary converter section 72*b* which are snap-fit together when pins 180 of the secondary converter section are inserted within corresponding indentations (not shown) in the primary converter section. Power converter 60 further includes two permeable cores 182, 184 and an extruded aluminum heat sink 62. More details of power converter 60 may be found in Vinciarelli et. al, U.S. application Ser. No. 08/077,011, filed Jun. 14, 1993, and entitled "Power Converter Configuration, Control, and Construction". Referring also to FIG. 4*c*, both the primary and secondary converter sections include internal PCBs 70 populated with sub-components 186. Portions of the internal PCBs extend from molding material 188 surrounding the sub-components to provide exposed electrical contacts 64 including contact pads 66.

The effective power density for a power converter is the power delivered per cubic inch of installed space. When determining the installed space for a converter, the total height of the space is equal to the maximum allowable height above and below the PCB, H1 and H2, respectively, and the thickness T1 of the PCB, for example, 0.062". For a single sided PCB (FIG. 1*a*), H1 is, for example, 0.500", and H2 is, for example, 0.060". For a double sided PCB (FIG. 1*b*), H1 and H2 are, for example, 0.250". When a power converter is mounted as shown in FIGS. 4*a*–4*c*, the installed space below the converter (T1 and H2) where no protrusions are located is wasted space which reduces the converter's effective power density. Reverse mounting a power converter as shown in FIGS. 5*a*–5*c* and 6*a*–6*c* minimizes the amount of wasted installed space and increases the converters effective power density.

In one example, the converter dimensions are 2.3" long, by 0.5' wide, by 0.45" tall, exclusive of contacts.

What is claimed is:

1. Power conversion apparatus comprising
   a circuit board having
      top and bottom faces separated by a thickness, and
      an aperture penetrating through the thickness from the top face to the bottom face,
   a sower converter having
      a body, and
      a first electrical conductor extending from the body in a direction generally perpendicular to the circuit board and having a free end to make electrical connection from the converter,
   the body of the sower converter lying in the aperture and extending above the aperture mostly on the side of the board which has the top face,
   a lead frame comprising a second conductor connected to the first electrical conductor and extending from the body in a direction generally parallel to the board at a location which is below the top face, and
   the first conductor further comprises a contact, and
   the lead frame further comprises a socket into which the contact plugs.

2. Power conversion apparatus comprising
   a circuit board having
      top and bottom faces separated by a thickness, and
      an aperture penetrating through the thickness from the top face to the bottom face,
   a power converter having
      a body, and
      a first electrical conductor extending from the body in a direction generally perpendicular to the circuit board and having a free end to make electrical connection from the converter,
      the first electrical conductor having a conductive path, connected to a circuit within the body and extending to the free end outside the body,
      the conductive path lying on a sub-board embedded within the body of the power converter,
   the body of the power converter lying in the aperture and extending above the aperture mostly on the side of the board which has the top face, and
   a second conductor connected to the first electrical conductor and extending from the body in a direction generally parallel to the board at a location which is below the top face.

3. Power conversion apparatus comprising
   a circuit board having
      top and bottom faces separated by a thickness, and
      an aperture penetrating through the thickness from the top face to the bottom face,
   a power converter having
      a body, and
      a first electrical conductor extending from the body in a direction generally perpendicular to the circuit board and having a free end to make electrical connection from the converter,
   the body of the power converter lying in the aperture and extending above the aperture mostly on the side of the board which has the top face,
   a second conductor connected to the first electrical conductor and extending from the body in a direction generally parallel to the board at a location which is below the top face, and
   a cap which shields the connection between the first electrical conductor and the second conductor from the environment.

4. The apparatus of claim 3 in which the cap passes through the aperture.

5. The apparatus of claim 3 in which the cap snap fits into the aperture.

* * * * *

UNITED STATES PATENT AND TRADEMARK OFFICE
CERTIFICATE OF CORRECTION

PATENT NO. : 6,031,726                                                 Page 1 of 1
DATED : February 29, 2000
INVENTOR(S) : Patrizio Vinciarelli, Jay Prager It is certified that error appears in the above-identified patent and that said Letters Patent is hereby corrected as shown below:

In the Claims:

Claim 1, Column 7,
Line 61, change "sower" to --power--.

Claim 1, Column 8,
Line 3, change "sower" to --power--.

Signed and Sealed this

Twelfth Day of June, 2001

*Attest:*

*Attesting Officer*

NICHOLAS P. GODICI
*Acting Director of the United States Patent and Trademark Office*